United States Patent
Durham et al.

(10) Patent No.: US 6,195,308 B1
(45) Date of Patent: Feb. 27, 2001

(54) SELF-TIMED ADDRESS DECODER FOR REGISTER FILE AND COMPARE CIRCUIT OF A MULTI-PORT CAM

(75) Inventors: Christopher McCall Durham; Peter Juergen Klim; Roy Keith Waite, all of Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/500,131

(22) Filed: Feb. 8, 2000

Related U.S. Application Data (62) Division of application No. 09/134,339, filed on Aug. 14, 1998, now Pat. No. 6,072,746.

(51) Int. Cl.[7] .................................................. G11C 8/00
(52) U.S. Cl. .............................. 365/230.06; 365/230.02
(58) Field of Search ....................... 365/230.06, 230.02; 326/105, 106, 108

(56) References Cited

U.S. PATENT DOCUMENTS

| | | | |
|---|---|---|---|
| 4,376,989 | 3/1983 | Takemae | 365/230 |
| 4,602,356 | 7/1986 | Nozaki et al. | 365/230 |
| 4,608,666 | 8/1986 | Uchida | 365/182 |
| 4,618,947 | 10/1986 | Tran et al. | 365/230 |
| 4,636,989 | 1/1987 | Ikuzaki | 365/222 |
| 4,638,462 | 1/1987 | Rajeevakumar et al. | 365/203 |
| 4,722,074 | 1/1988 | Fujishima et al. | 365/203 |
| 4,725,945 | 2/1988 | Kronstadt et al. | 364/200 |
| 4,754,433 | 6/1988 | Chin et al. | 365/189 |
| 4,758,987 | 7/1988 | Sakui | 365/189 |
| 4,800,531 | 1/1989 | Dehganpour et al. | 365/222 |
| 5,015,881 | 5/1991 | Chappell et al. | 307/449 |
| 5,185,719 | 2/1993 | Dhong et al. | 365/189.01 |
| 5,280,204 | 1/1994 | Livolski | 307/475 |
| 5,327,390 | 7/1994 | Takasugi | 365/230 |
| 5,341,341 | 8/1994 | Fukuzo | 365/233 |
| 5,394,373 | * 2/1995 | Kawamoto | 365/230.06 |
| 5,524,115 | 6/1996 | Kim | 371/10.3 |
| 5,528,552 | 6/1996 | Kamisaki | 365/238.5 |
| 5,737,270 | 4/1998 | Oppold et al. | 365/203 |
| 5,783,949 | 7/1998 | Reohr et al. | 326/106 |

* cited by examiner

Primary Examiner—Vu A. Le
(74) Attorney, Agent, or Firm—Kelly K. Kordzik; Winstead Sechrest & Minick P.C.; Anthony V. S. England (57) ABSTRACT

A circuit evaluates a plurality of data inputs, provides for stabilization of the evaluation, and then drives the evaluation from the circuit. The providing of the stabilization is performed by delaying an activation signal, which controls the evaluation circuitry. The activation signal may be either a clock signal or a reset signal. This circuit may be an address decoder that decodes certain ones of the address signals during the evaluation phase, and then drives the evaluation during the second phase.

10 Claims, 14 Drawing Sheets

Fig. 4
(con't)

SELF-TIMED ADDRESS DECODER FOR REGISTER FILE AND COMPARE CIRCUIT OF A MULTI-PORT CAM

TECHNICAL FIELD

This is a division of application Ser. No. 09/134,339 filed Aug. 14, 1998 U.S. Pat. No. 6,072,746.

The present invention relates in general to data processing systems, and in particular, to an address decoder.

BACKGROUND INFORMATION

To achieve high speed operation of a register file, fast read and write address decodes are essential. Register file decodes are usually done by pre-decoding the addressing lines by ANDing two or more addresses together, then distributing these ANDed lines to the wordline drivers where final decode is done by ANDing again. When the decoded signals are stable, a clock signal then enables the wordline drivers allowing the one wordline driver with the proper decode to activate a DECOUT line to the storage cells of the register file which then either reads or writes the data in the storage cell. Since the speed of the register file is rated in terms of the arrival of the address to the data coming out, the faster the address can be decoded, the faster the register file. The arrival of the addresses are measured relative to a clock signal, which tells the register file that the addresses are now valid and the register file access can now proceed.

Figure 9:
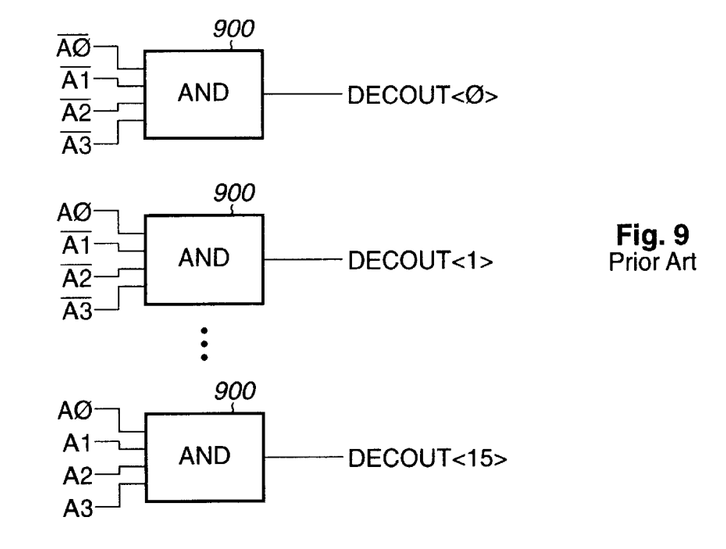
FIGS. 9–12 illustrate a prior art address decoder.
Figure 10:
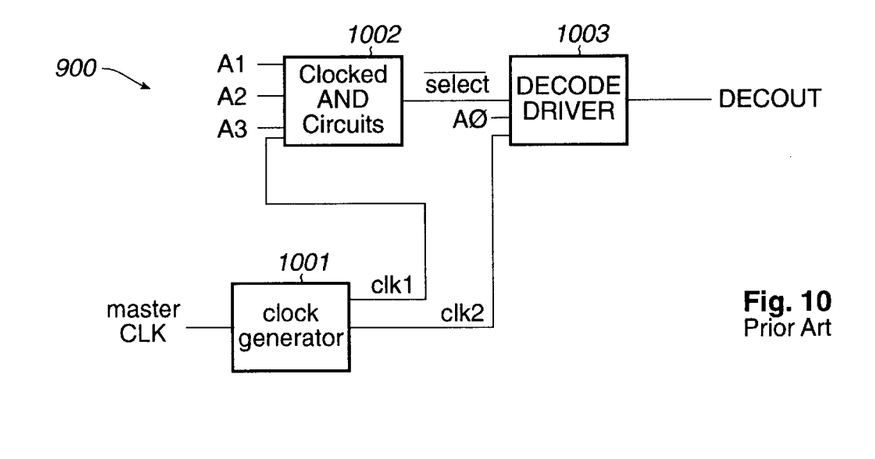

FIG. 9 illustrates typical circuitry for implementing address decoders for accessing such register files. The address signals are received by AND circuits 900 for decoding. FIG. 10 illustrates further detail of each AND circuit 900. A clock generator 1001 must distribute clock signals CLK1 and CLK2 throughout the circuit 900, accounting for skew and process variations across the circuit. The first clock signal CLK1 activates the decoding of address signals A1, A2, and A3 by clocked AND circuits 1002 to produce the select signal, which is then received by decode driver circuit 1003 along with another one of the address signals A0. Decode driver 1003 is activated by the second clock signal CLK2 to produce output DECOUT. In circuit 900, it must be guaranteed that clock signal CLK1 rises and there is sufficient time for all select signals to be resolved before the rising of the second clock signal CLK2. Then each of circuits 900 must guarantee that signal CLK2 falls before signal CLK1 falls.

Figure 11:
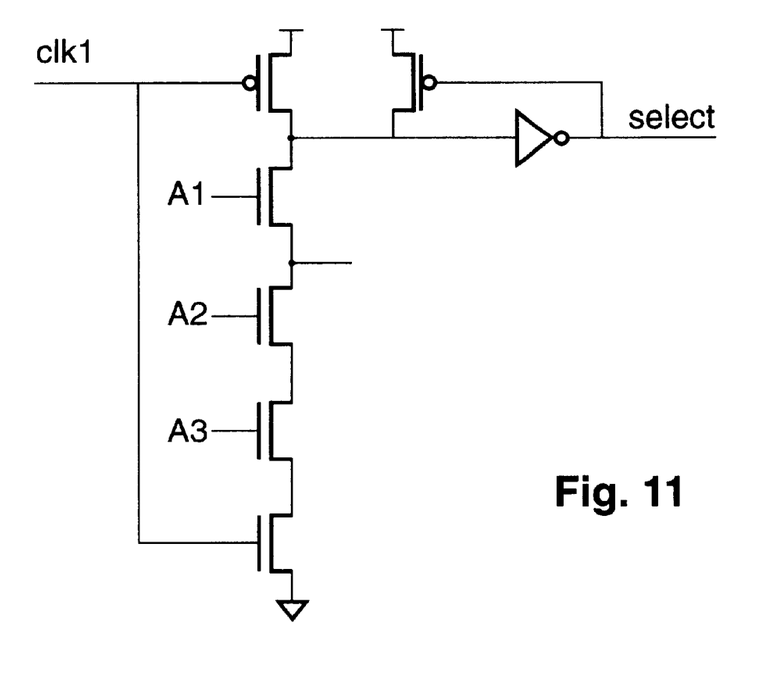
Figure 12:
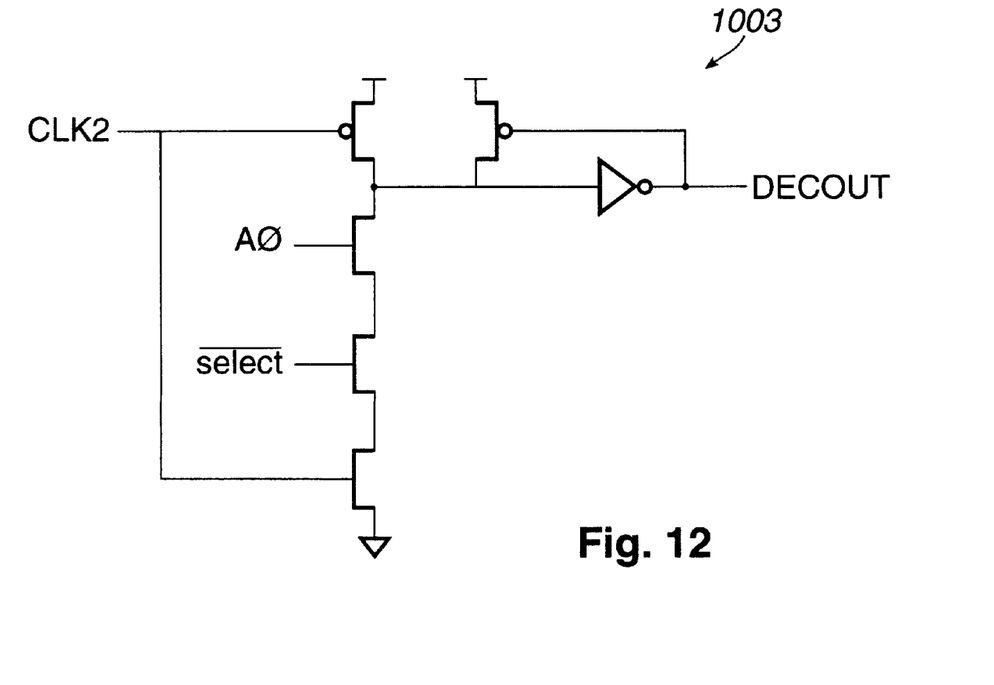

FIGS. 11 and 12 illustrate specific circuit implementations of circuits 1002 and 1003, respectively, using dynamic circuit architecture.

What is needed in the art is an address decoder that does not have the problems associated with the prior art address decoder illustrated in FIGS. 9–12 through its implementation of two separate clock signals.

SUMMARY OF THE INVENTION

The present invention addresses the foregoing needs by providing an address decoder that evaluates a portion of the incoming address signals, insures that this evaluation stabilizes, and then drives the evaluation as an output. This is accomplished using one clock signal, instead of the two used within the prior art. To insure that the evaluated signal stabilizes, the portion of the circuit that drives the output is activated by a delayed clock signal produced by delaying the original clock signal.

In another embodiment of the present invention, substantially the same circuitry can be utilized within a self-timed address decoder where the clock signal is replaced by a reset signal.

In yet another embodiment, a multi-port CAM can benefit from the increase in speed afforded by the circuit techniques of the present invention.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

In the following description, numerous specific details are set forth such as specific word or byte lengths, etc. to provide a thorough understanding of the present invention. However, it will be obvious to those skilled in the art that the present invention may be practiced without such specific details. In other instances, well-known circuits have been shown in block diagram form in order not to obscure the present invention in unnecessary detail. For the most part, details concerning timing considerations and the like have been omitted inasmuch as such details are not necessary to obtain a complete understanding of the present invention and are within the skills of persons of ordinary skill in the relevant art.

Refer now to the drawings wherein depicted elements are not necessarily shown to scale and wherein like or similar elements are designated by the same reference numeral through the several views.

Instead of using AND gates to perform the decode operation, the present invention uses a circuit that implements a negative decode process, wherein all of the wordlines are selected during the clock off time. Then when the clock turns on, all but the selected wordline will be deselected, or turned off, just before the clock enables the wordline driver portion of the circuit to send the selected signal onto the storage cells. The unusual way in which the present invention accomplishes this is by use of a set of timing transistors located in the same spot as the decode circuit and wordline drivers that enable an immediate kick-off of the decoded signal without losing time with multi-staged clocking signals, which would be burdened with skew and transmission line delays.

Figure 1:
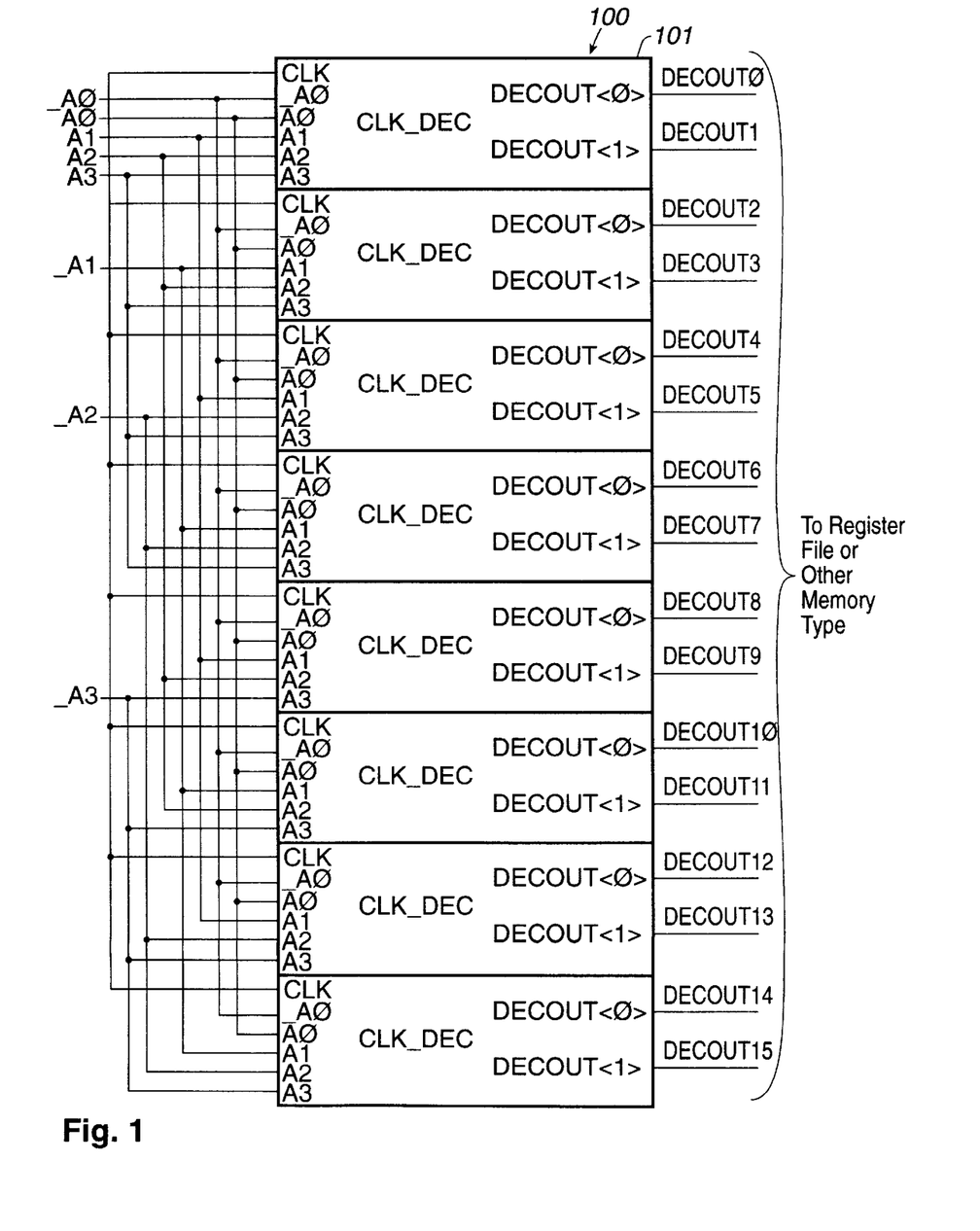
FIG. 1 illustrates a clocked address decoder.
Figure 2:
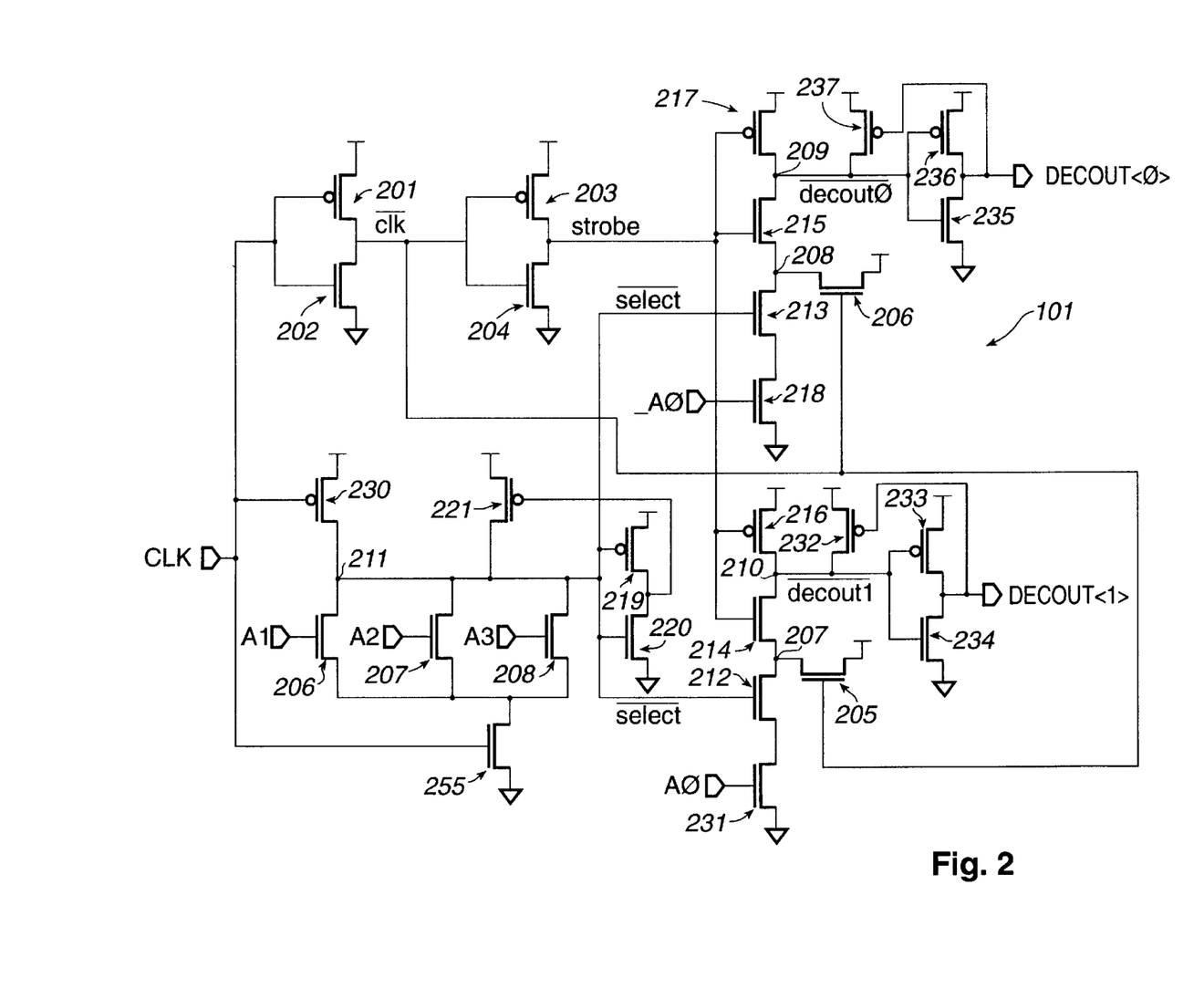
FIG. 2 illustrates a circuit diagram of a cell of the clocked address decoder of FIG. 1.

A block diagram of the clocked decoder 100 for a 16-bit entry register file in accordance with the present invention is depicted in FIG. 1. The 16-bit entry register file is picked as an example, however, the discussion that follows is applicable for any size register file. FIG. 2 shows the details of the clk_dec block 101 circuit (notice that two addresses are decoded in each block), where the address strobe is generated by the system clock (clk) delayed by the two inverters (or more as required) consisting of FETs 201–204. The output clk of the inverter comprising FETs 201 and 202 is also connected to transistors 205 and 206, which precharge nodes 207 and 208, respectively, to Vdd-Vt in order to reduce the effect of charge sharing on nodes 209 and 210, respectively. FETs 205 and 206 may not be required in different technologies or with different transistor sizes. The address decoder is designed such that the select node 211 is precharged high when the clock (clk) is low, thus turning on transistors 212 and 213. The delayed clock (strobe) turns off FETs 214 and 215 and turns on FETs 216 and 217, precharging nodes 209 and 210 to Vdd, which causes outputs DECOUT<1> and DECOUT<0> to go low.

Typically data address bits A3 through A0 will be active before the clock goes high via a transparent latch. Notice that the select node 211 is high until any or all of high order addresses A3 through A1 go high, which prevents the corresponding DECOUTn from going active. Thus, the default is that all select signals are high until they are not selected by any of the inputs A3 through A1 going high.

Only one decoded address in the register file will remain active during any address phase. The low order address A0 and its complement _A0 will activate only either DECOUT<0> or DECOUT<1>. As an example, for Address 0000: _A0 goes high, A3 through A1 remain low and as the clock goes high, DECOUT<0> goes high because FET 215 is turned on by the strobe signal, FET 213 has been on all along since the completion of the precharge operation, and FET 218 was turned on when _A0 went high. DECOUT<1> remains inactive because A0 is low, even though select and strobe are both high. The outputs DECOUT2 and DECOUT3 remain inactive because the select line of the adjacent cell (see FIG. 1) is pulled down when _A1 goes high. Similarly all other decoded addresses remain inactive.

Figure 3:
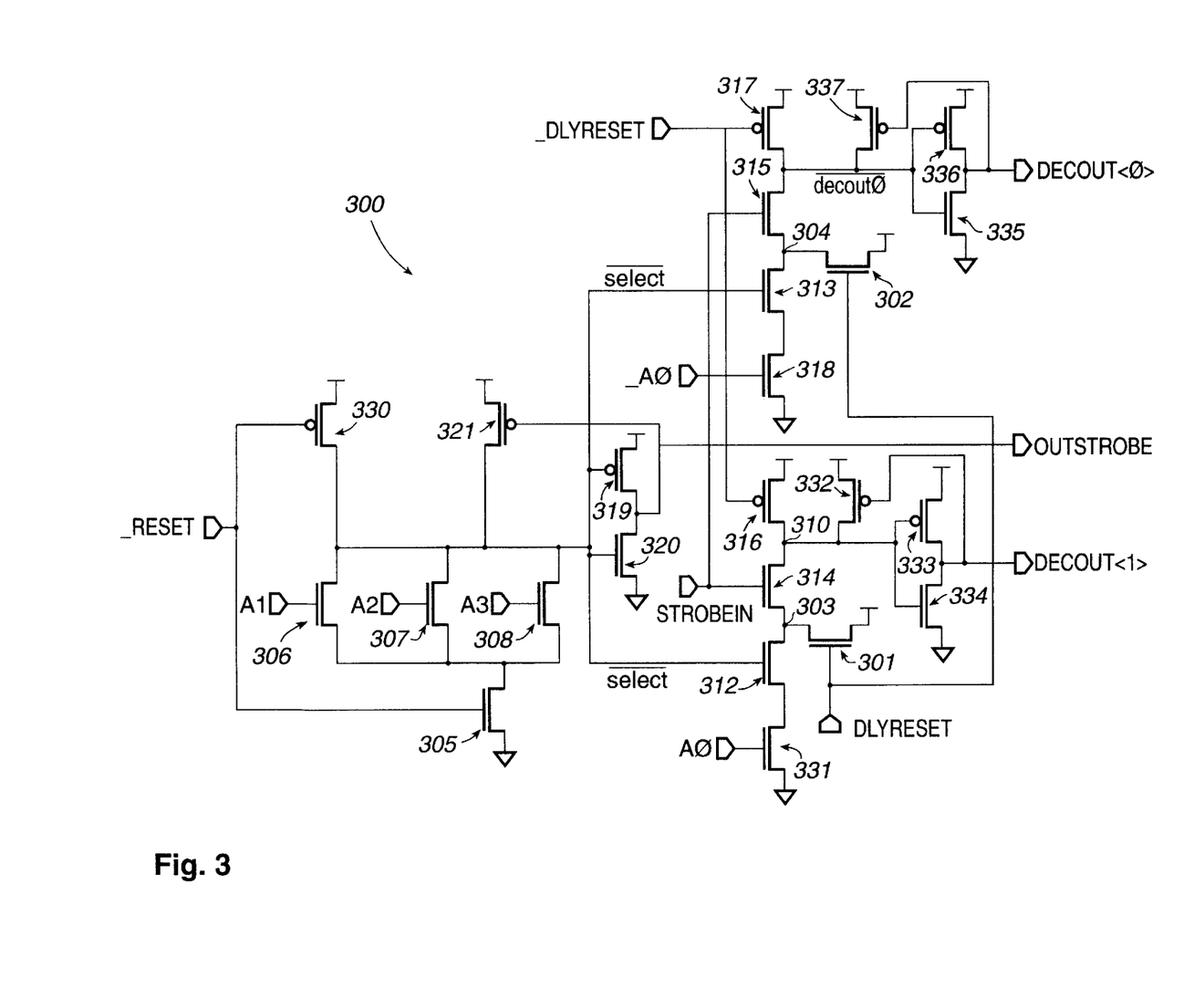
FIG. 3 illustrates a self-timed address decoder circuit.
Figure 13:
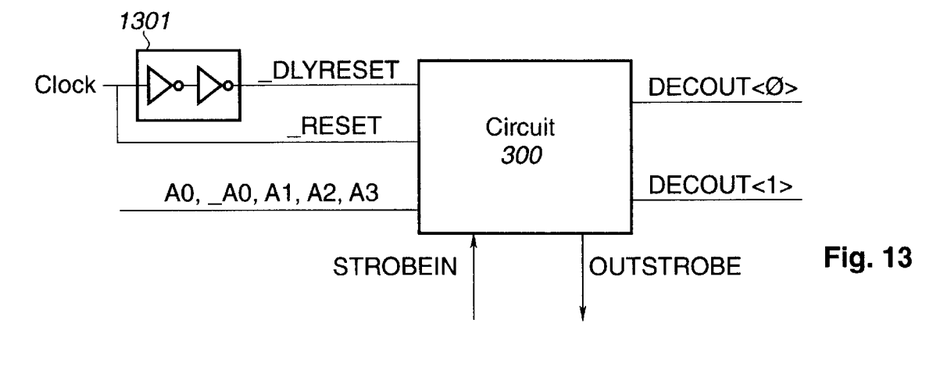
FIGS. 13–18 illustrate various embodiments for creating the reset and delayed reset signals.
Figure 14:
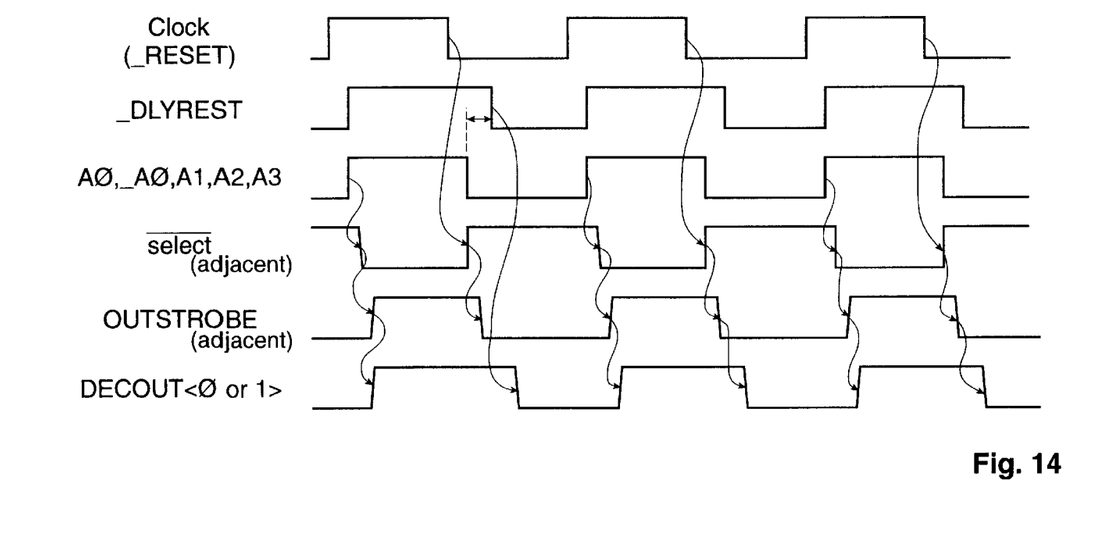

Referring next to FIG. 3, there is illustrated an alternative embodiment of the present invention suitable for use in self-timed implementations. Without the clock dependency of address decoder 100, an input generated self-timed address strobe is utilized in circuit 300. The address decoder may now interface seamlessly with self-timed and self-resetting circuits while maintaining its compatibility with clocked systems. Circuit 300 performs a similar logic function as the circuit 101 of FIG. 2. Devices 306–308, 330–337, and 305 perform similar functions as devices 206–208, 230–237, and 255, respectively. Notice that the clock input has been removed, and the precharge operation is now performed by _RESET and _DLYRESET. DLYRESET is the invert of _DLYRESET and is responsible for turning on optional charge sharing devices 301 and 302 in order to precondition nodes 303 and 304, respectively. These signals may be generated by self-timed or self-resetting methods and are dependent upon the system conditions. If the _RESET and _DLYRESET signals are produced using a clock signal, then a circuit such as illustrated in FIG. 13 may be utilized. A delay element 1301 is used to stretch and delay the clock signal to produce _DLYRESET. This is because the second stage is not footed and at least one input must be off before _DLYRESET may go low. The timing for the various signals within the circuit in FIGS. 3 and 13 are illustrated in FIG. 14.

Figure 15:
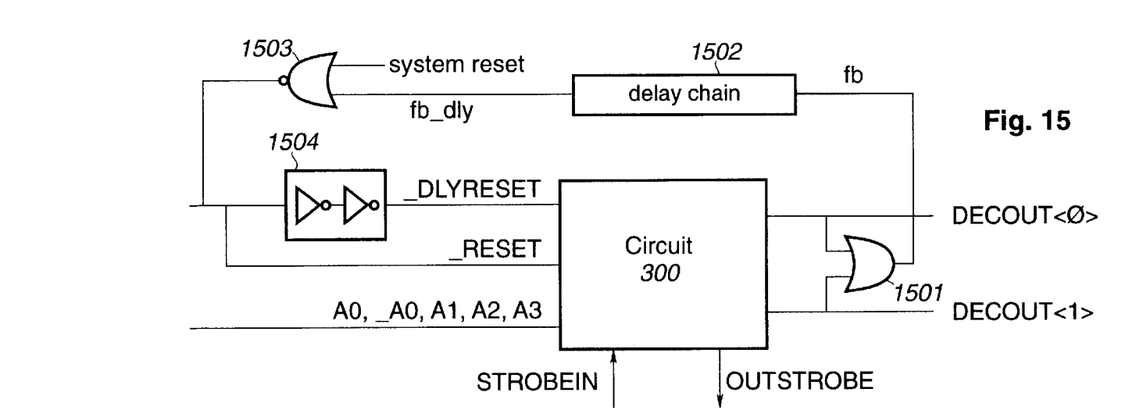

In a self-resetting implementation, the circuitry illustrated in FIG. 15 may be utilized. The output signals from circuit 300 are ORed by OR gate 1501 producing the fb signal, which is delayed by delay chain 1502 to produce fb_dly, which is NORed by NOR gate 1503 with a system reset signal. The output of the NOR gate 1503 is used as the _RESET signal, and is delayed by delay element 1504 to produce the _DLYRESET signal. A timing diagram for this circuit is illustrated in FIG. 16.

With the circuit in FIG. 15, more than one output pair may be connected to one OR gate.

Figure 16:
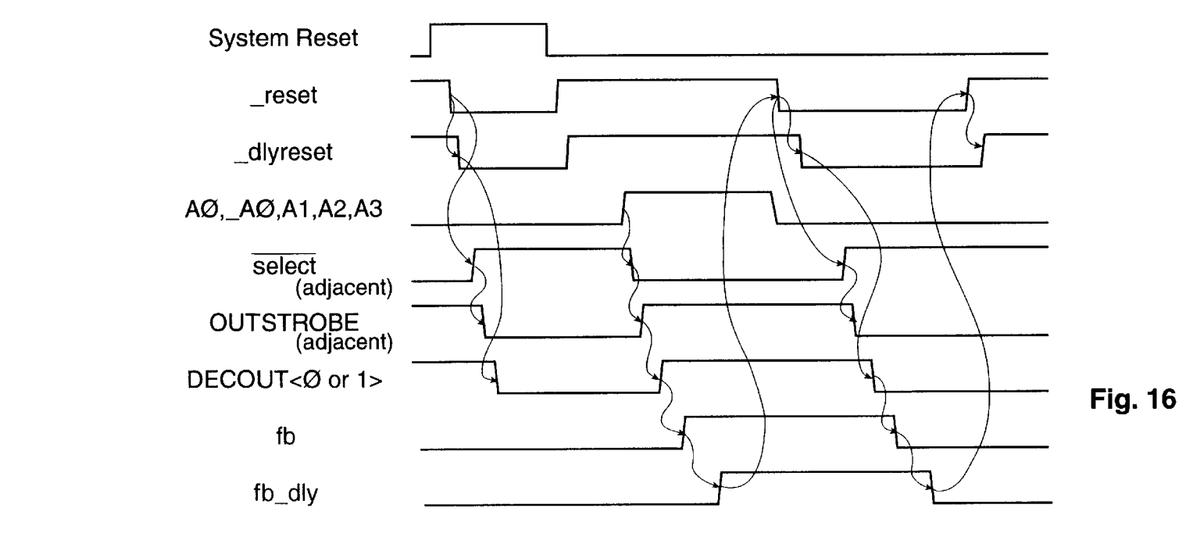

The A0, _A0, A1, A2, A3 signals should have been tuned such that the input waveform is as shown in the timing diagram in FIG. 16. The delay chain 1502 may delay the following edge with a shorter delay to expedite the "reset" of the reset. The system reset it shown to initialize the system. The OR gate 1501 sees two low inputs during reset operations. When one output goes high, signal fb also goes high and the sequence as shown in the timing diagram is triggered.

Figure 17:
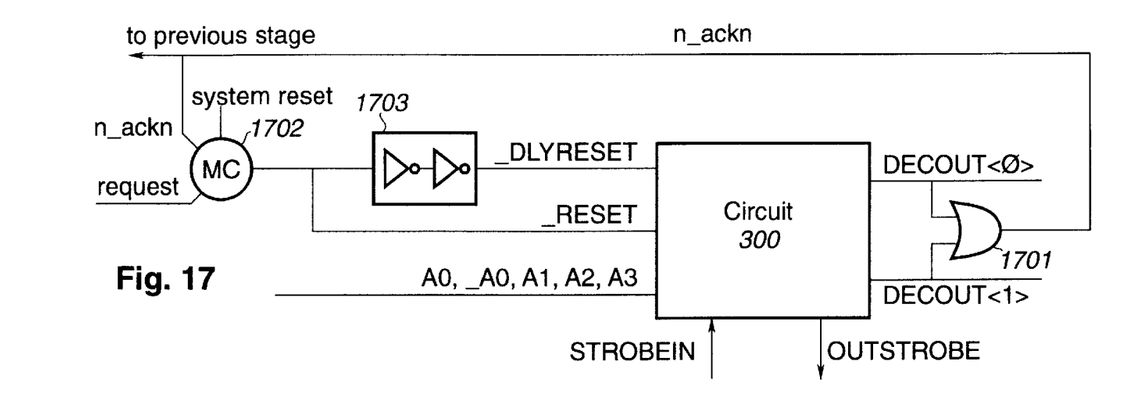

In a self-timed implementation, the circuitry illustrated in FIG. 17 may be utilized. Again, the output signals are ORed by OR gate 1701 to produce the n_ackn signal. This signal is sent to the previous stage and is sent to a mueller-c element 1702, which also receives a system reset signal and a request signal producing an output signal that is used as the _RESET signal. The output of the mueller-c element 1702 is delayed by delay element 1703 to produce the _DLYRESET signal. The truth table for the mueller-c element 1702 is as follows:

| request | n_ackn | reset |
| --- | --- | --- |
| 0 | 0 | 0 |
| 0 | 1 | $reset_{t-1}$ |
| 1 | 0 | $reset_{t-1}$ |
| 1 | 1 | 1 |

The $reset_{t-1}$ values keep the value when the inputs are not equal.

The request signal is issued by the previous stage and signal n_ackn (acknowledge) is fed back to the previous stage. If this handshake is not desired, a clock input could also be used, but cycle time has to be designed in.

Figure 18:
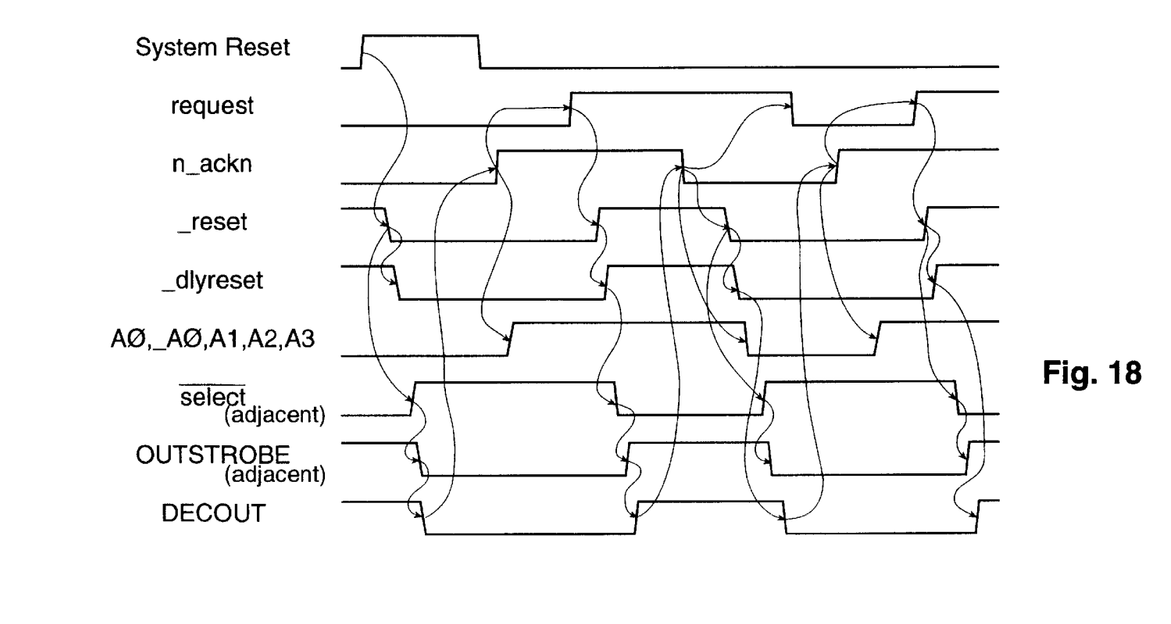

The timing diagram for the circuit illustrated in FIG. 17 is illustrated in FIG. 18. The request signal may be issued before signals A0–A3. The previous stage sends a request when the acknowledge of the current stage is high. It may send signals A0–A3 earlier, together with the request signal or later depending upon the protocol. When the request signal goes high, _RESET and _DLYRESET go high (for this discussion they are assumed to be low initially either due to system reset or normal operation), taking the circuit out of reset. A0–A3 will now evaluate. The circuit and one of the DECOUT's goes high. n_ackn goes low in forming the previous stage to lower the request signal and change signals A0–A3. When the previous stage lowers the request signal, _RESET and the _DLYRESET go low, putting the circuit into the reset condition. Both DECOUTs will be high during reset and n_ackn goes high, informing the previous stage to send another request. When the request signal goes high, _RESET and then _DLYRESET go high and the sequence is repeated.

Under some circumstances "foot device" 305 may be removed to improve the speed of the circuit 300.

Figure 4:
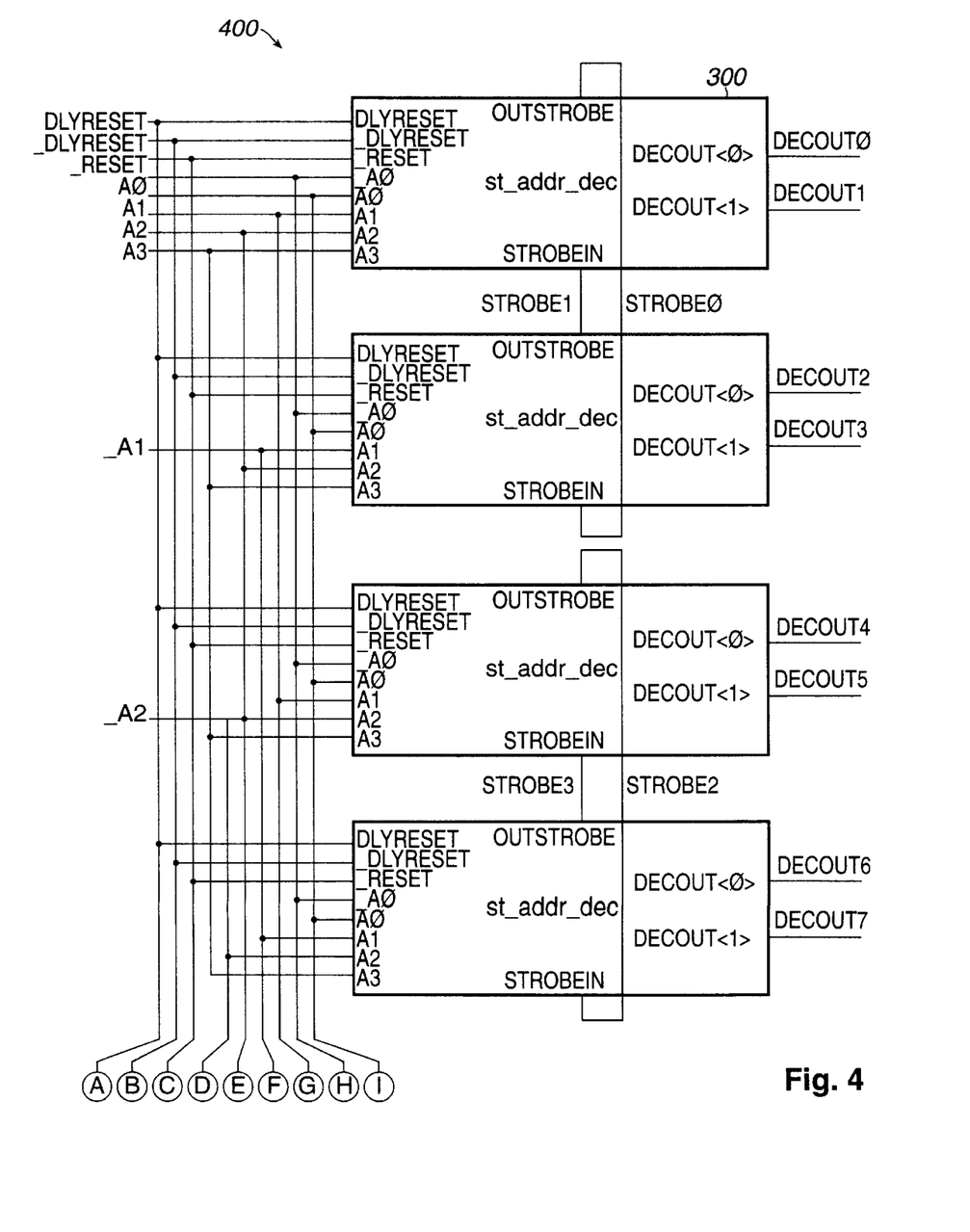
FIG. 4 illustrates a self-timed address decoder for a 16-entry register file.

While the function of the inverter consisting of FETs 319 and 310 is to turn on half latch 321, it also drives the signal OUTSTROBE. Additionally referring to FIG. 4, where the complete address decoding scheme for the self-timed decoder 400 is illustrated, each block, st_addr_dec, contains circuit 300 as depicted in FIG. 3. Dual rail address bits A0/_A0 through A3/_A3 are connected in such a way that all except one of the eight circuits generate a strobe. Therefore, it is sufficient to connect the OUTSTROBE of a circuit 300 only to the STROBEIN input of its adjacent neighbor as indicated in FIG. 4. The circuit driving the only active DECOUTn output (representing a wordline or read select) in the array, is the only one where the select signal in circuit 300 is not pulled down, its corresponding input A0/_A0 is high, and it receives a strobe from an adjacent circuit. It is the only circuit that does not generate a strobe, because FETs 306–308 do not turn on. It is not necessary to generate a strobe to be received by the adjacent decoder, since its output stage does not evaluate.

Figure 5:
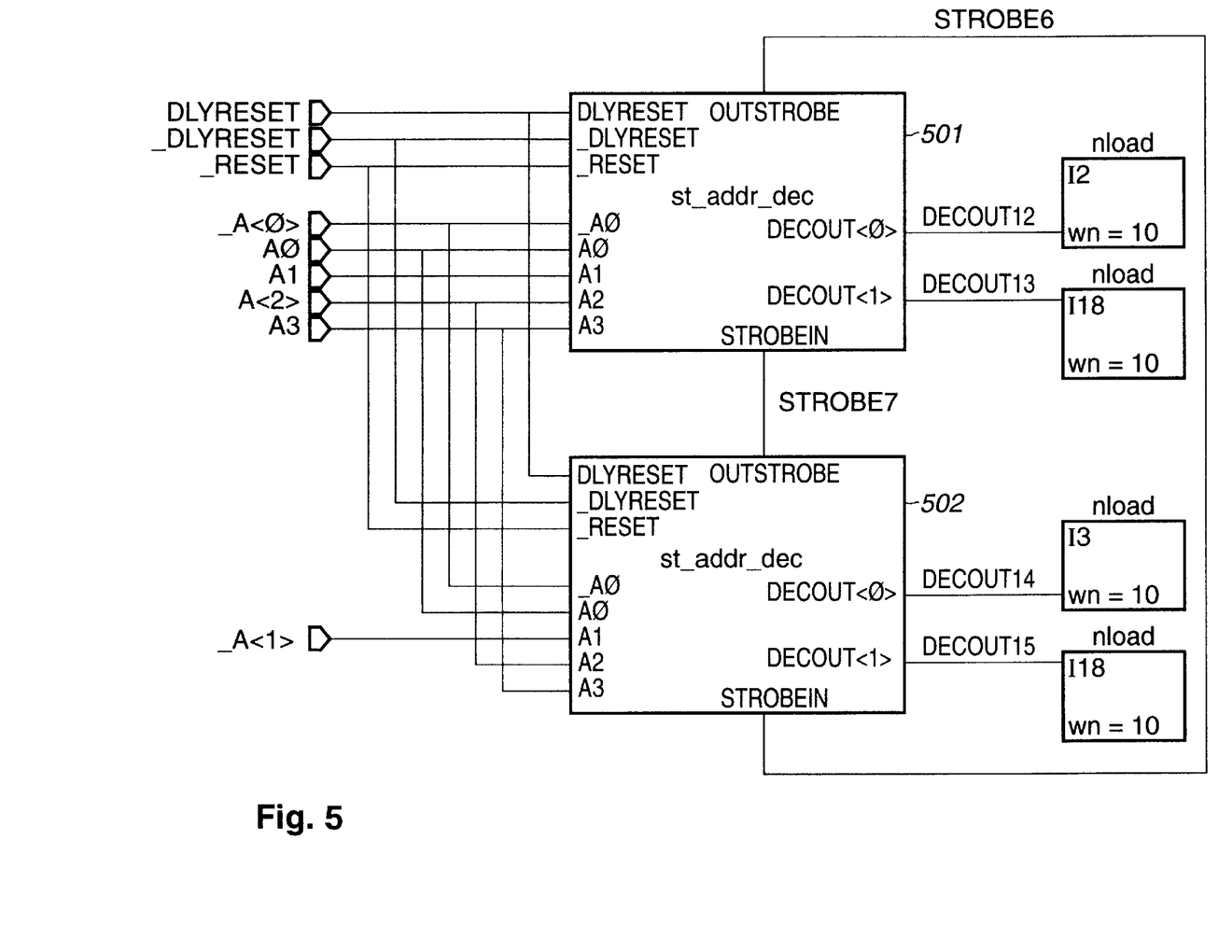
FIG. 5 illustrates a simulation circuit.
Figure 6:
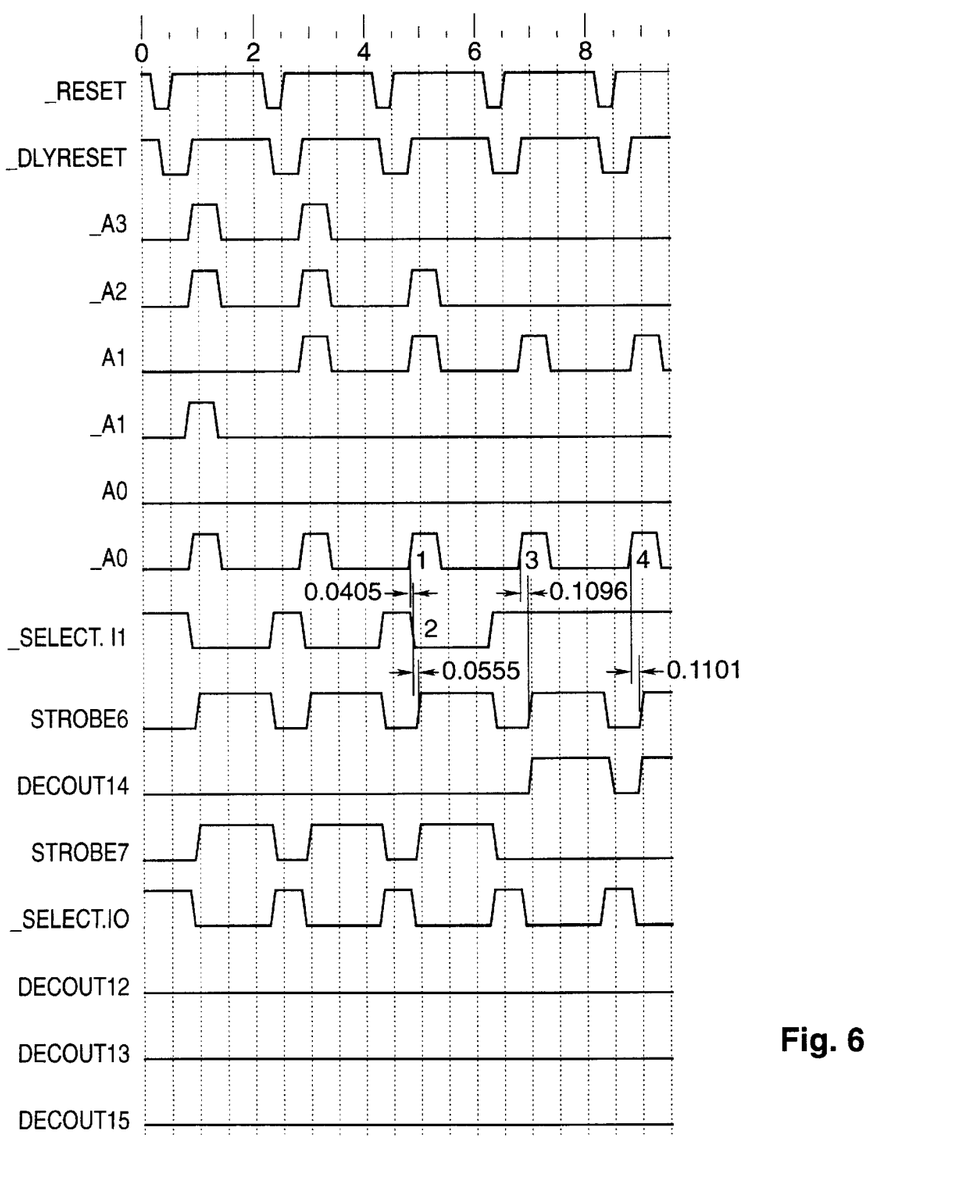
FIG. 6 illustrates simulation results for the circuit of FIG. 5.

Simulations were performed in accordance with the circuit diagram in FIG. 5, choosing the example of outputs DECOUT12 through 15. FIG. 6 contains the input stimulus and the simulation results. Five evaluations are shown. After initial precharge is performed, the addresses A3 through A0 are 0000 (complements _A3 through _A0 are high). Internally both circuits lower their internal select lines (_SELECT.I0 for block 501 and SELECT.I1 for block 502). Both circuits also generate strobes (STROBE6 and STROBE7 respectively). During the second cycle, the circuits receive address 0010 and during the third cycle 1010 with same results as during the first cycle. Addresses 1110 (14 decimal) are issued during the fourth and fifth cycle. As expected _SELECT.I1 stays high and STROBE7 is not generated. However STROBE6 is generated and DECOUT14 goes high. The signal relationships indicated in the timing diagram show the strobe signals are generated one inverter delay after $\overline{select}$ goes low ($\overline{select}$ is the same as _SELECT). This is necessary such that the $\overline{select}$ input to devices 313 and 312 is able to turn off the transistors before the strobe occurs if the address is not selected.

Pairing the circuits as done in the invention minimizes turning off devices 319 and 320. In the case when A3 through A1 are all high, the strobe would be significantly faster than the case when only A1 is high. However the adjacent circuit will have A3 and A2 on as well such that its select line is sufficiently fast "to beat" the strobe to the output AND circuit, hence no false evaluation may occur. If the number of address bits increase there still will only be one bit difference between each adjacent circuit, and the pairing advantage is maintained.

Figure 7:
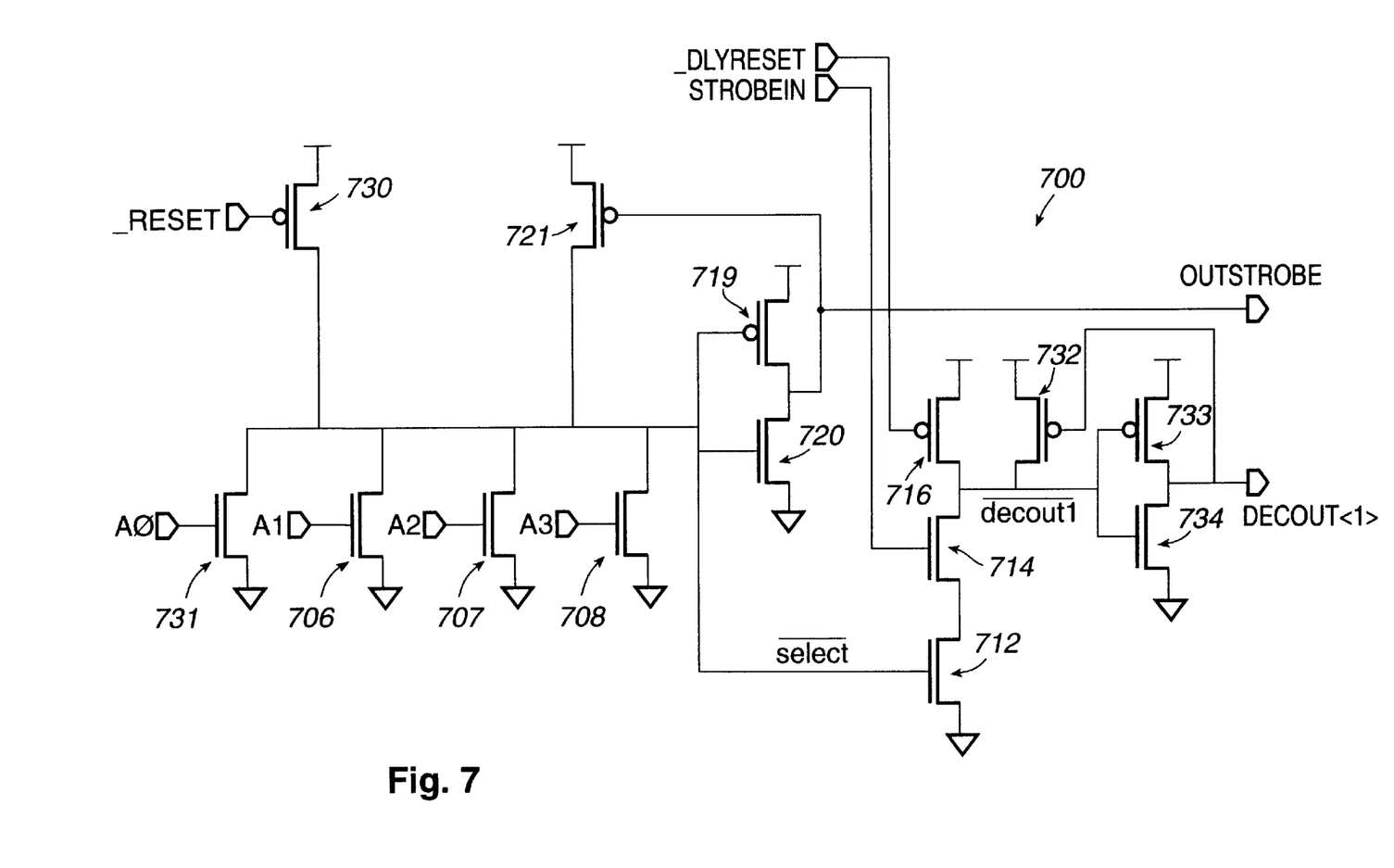
FIG. 7 illustrates an alternative embodiment of the present invention.

An alternative solution for the decoder is shown in FIG. 7, where the optional "foot device" 305 and charge sharing device have been omitted. This decoder is repeated for each address. Devices 706–708, 712, 714, 716, 719–721, and 730–734 perform functions similar to devices 306–308, 312, 314, 316, 319–321, and 330–334, respectively. When the decoder 700 is not selected ($\overline{select}$ is low), it still receives a strobe (STROBEIN) from the adjacent circuit. At the time of reset, $\overline{select}$ goes high before the strobe goes low and the circuit might evaluate. The solution for circuit 300 in FIG. 3 is to set address A0/_A0 to zero before the reset is issued (see timing diagram FIG. 6). This solution does not apply here. However, several solutions exist to overcome the problem. The most obvious one is putting a "foot device" into a following stage and timing the reset such that the evaluation of the decoder is masked.

Figure 8:
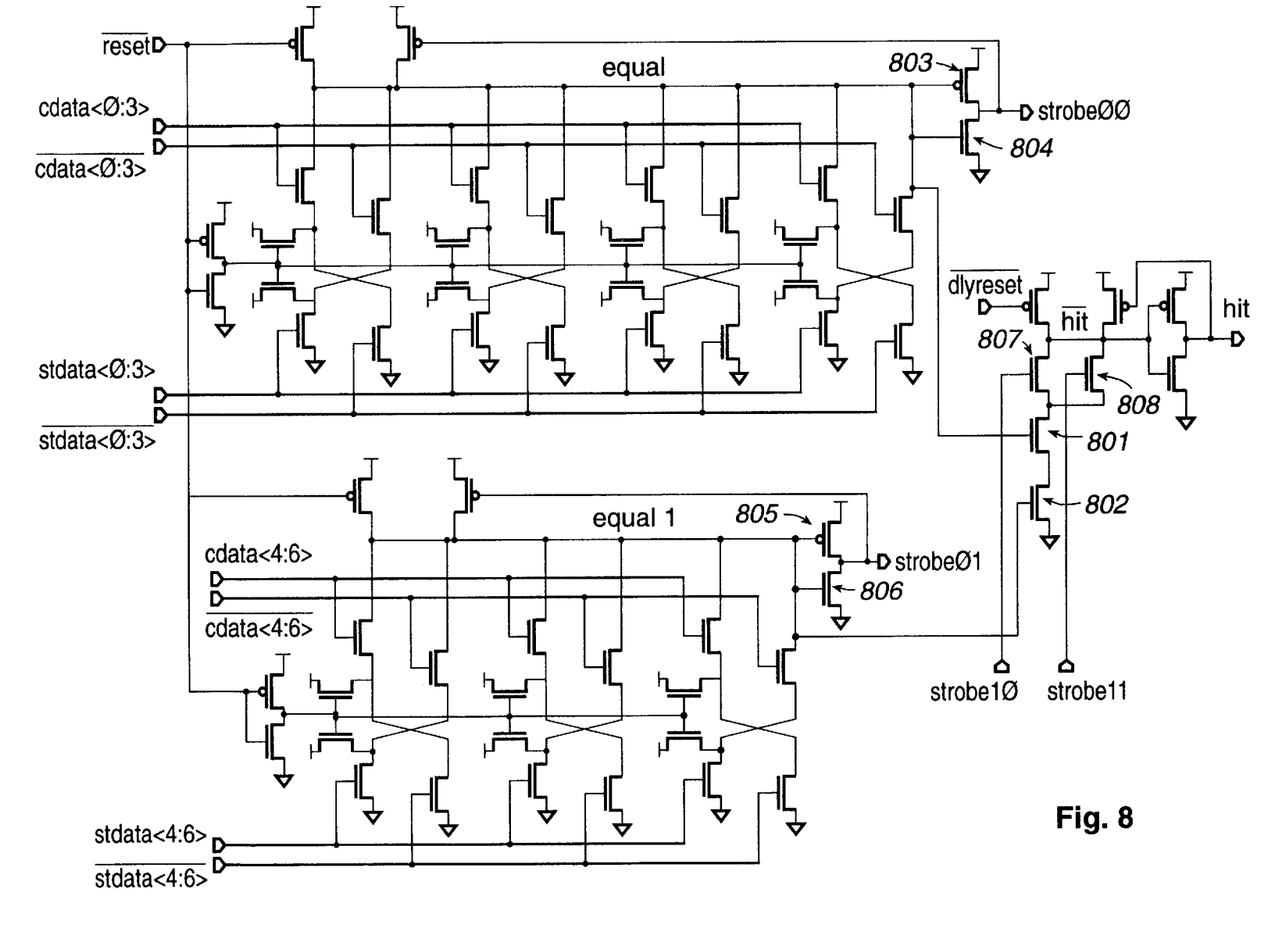
FIG. 8 illustrates a comparator for a multi-port CAM configured in accordance with the present invention.

FIG. 8 shows that this self-timed method might be deployed in other circuits as well. The illustration shows an implementation of a seven bit comparator for a multi-port Content Addressable Memory (CAM). The circuit is designed such that if inputs do not compare, the initially precharged (Vdd) lines equal and/or equal1 are pulled down by one or more non-compares, turning off transistors 801 and/or 802 and hence preventing the hit output from going high. This operation also generates the strobe00 and/or strobe01 for the adjacent circuit. The strobe10 and strobe11 input are obtained from respective strobe00 and strobe01 outputs from adjacent circuits. The requirement for this scheme to work is that only one hit may occur in the array. Careful tuning of 803 and 804 and 805 and 806 are required, because between 1 and 7 noncompares may occur in the adjacent circuit that generates the strobe. The more non-compares occur in a circuit the faster the strobe becomes generated. The adjacent circuit that might experience a non-compare, however, must have sufficient time to pull down its equal/equal1 lines before the strobe is issued. If the adjacent circuit has a valid compare condition, equal and equal1 remain high, 801 and 802 are on and the strobe now turns on 807 and/or 808, which then pulls $\overline{hit}$ to zero and output hit goes high.

Although the present invention and its advantages have been described in detail, it should be understood that various changes, substitutions and alterations can be made herein without departing from the spirit and scope of the invention as defined by the appended claims.

What is claimed is:

1. A circuit comprising:
    circuitry for receiving a reset signal;
    a circuit for evaluating a plurality of data inputs in response to the reset signal to produce an evaluated signal;
    circuitry for receiving a strobe signal; and
    a driver circuit for driving the evaluated signal from an output in response to the strobe signal.

2. The circuit as recited in claim 1, wherein the strobe signal is sufficiently delayed relative to the reset signal to permit the evaluated signal to stabilize before being driven by the driver circuit.

3. The circuit as recited in claim 1, wherein the strobe signal originates from a reset pulse from another circuit.

4. The circuit as recited in claim 1, wherein the evaluate circuit comprises an OR circuit for ORing the plurality of data inputs, and wherein the driver circuit comprises an AND circuit for ANDing the strobe signal with the evaluated signal.

5. The circuit as recited in claim 4, wherein the driver circuit ANDs the strobe signal and the evaluated signal with another data input.

6. The circuit as recited in claim 5, further comprising a second driver circuit for ANDing the strobe signal and evaluated signal with a complement of the another data input.

7. A method for decoding first and second sets of input data signals, comprising:
    receiving the first set of input data signals by a first decoder circuit;
    receiving the second set of input data signals by a second decoder circuit;
    evaluating certain ones of the first set of input data signals in response to a reset signal to produce a first select signal;
    evaluating certain ones of the second set of input data signals in response to the reset signal to produce a second select signal;

delaying the first select signal to produce a first strobe signal; and evaluating the second select signal, the first strobe signal, and one or more other ones of the second set of input data signals.

8. The method as recited in claim 7, further comprising:

evaluating the second select signal, the first strobe signal, and a complement of the one or more other ones of the second set of input data signals.

9. The method as recited in claim 7, wherein the evaluating of the certain ones of the second set of input data signals is performed by a dynamic OR circuit, and wherein evaluating the second select signal, the first strobe signal, and one or more other ones of the second set of input data signals is performed by a dynamic AND circuit.

10. The method as recited in claim 7, wherein the first strobe signal is delayed sufficiently relative to the second select signal that the second select signal is stabilized before the evaluating of the second select signal, the first strobe signal, and one or more other ones of the second set of input data signals is performed.

\* \* \* \* \*